United States Patent
Kim et al.

(10) Patent No.: US 12,169,419 B2
(45) Date of Patent: Dec. 17, 2024

(54) CLOCK GENERATING CIRCUIT AND METHOD FOR TRIMMING PERIOD OF OSCILLATOR CLOCK SIGNAL

(71) Applicant: SAMSUNG ELECTRONICS CO., LTD., Suwon-si (KR)

(72) Inventors: Hyunil Kim, Seongnam-si (KR); Jisu Kang, Seoul (KR); Taewook Park, Seoul (KR); Hongmook Choi, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 266 days.

(21) Appl. No.: 17/841,078

(22) Filed: Jun. 15, 2022

(65) Prior Publication Data
US 2022/0404859 A1 Dec. 22, 2022

(30) Foreign Application Priority Data
Jun. 17, 2021 (KR) .................. 10-2021-0078994

(51) Int. Cl.
| | | |
|---|---|---|
| *G06F 1/10* | (2006.01) | |
| *G06F 1/08* | (2006.01) | |
| *G06F 1/12* | (2006.01) | |
| *G11C 29/02* | (2006.01) | |
| *G11C 29/56* | (2006.01) | |
| *H03K 21/38* | (2006.01) | |

(52) U.S. Cl.
CPC .................. *G06F 1/10* (2013.01); *G06F 1/08* (2013.01); *G06F 1/12* (2013.01); *G11C 29/023* (2013.01); *G11C 29/56004* (2013.01); *H03K 21/38* (2013.01)

(58) Field of Classification Search
CPC ..... G06F 1/10; G06F 1/08; G06F 1/12; G11C 29/023; G11C 29/56004; G01R 31/31922; H03K 21/38
USPC ...................... 331/1 A, 4, 2, 177 R; 327/159
See application file for complete search history.

(56) References Cited

U.S. PATENT DOCUMENTS

| | | |
|---|---|---|
| 4,567,447 A | 1/1986 | Srivastava et al. |
| 6,320,469 B1 | 11/2001 | Friedberg et al. |
| 7,495,488 B2 | 2/2009 | Kim |
| 8,085,099 B2 | 12/2011 | Pancholi et al. |
| 8,810,321 B2 | 8/2014 | Choi |
| 8,841,974 B2 | 9/2014 | Sul et al. |
| 9,983,262 B1 | 5/2018 | Trock et al. |

(Continued)

FOREIGN PATENT DOCUMENTS

| | | |
|---|---|---|
| JP | 2009-218653 A | 9/2009 |
| KR | 10-1517389 B1 | 5/2015 |
| KR | 10-1632467 B1 | 7/2016 |

*Primary Examiner* — Arnold M Kinkead
(74) *Attorney, Agent, or Firm* — Sughrue Mion, PLLC

(57) ABSTRACT

A clock generating circuit includes an oscillator, a clock counter, a finite state machine, and a non-volatile memory. The oscillator outputs an oscillator clock signal having a period based on a trim value. The clock counter counts the oscillator clock signal for a reference time. The finite state machine obtains the count value of the counted oscillator clock signal from the clock counter, and in a test mode, compares the count value with a target count value and changes the trim value based on the comparison result and determines a final trim value based on the changed trim value. The non-volatile memory stores the final trim value that is determined.

19 Claims, 9 Drawing Sheets

(56) References Cited

U.S. PATENT DOCUMENTS 10,027,365 B2 7/2018 Yun
2013/0093505 A1* 4/2013 Gupta .................... G05F 1/575
  327/540

* cited by examiner

CLOCK GENERATING CIRCUIT AND METHOD FOR TRIMMING PERIOD OF OSCILLATOR CLOCK SIGNAL

CROSS-REFERENCE TO RELATED APPLICATION

This application is based on and claims priority under 35 U.S.C. § 119 to Korean Patent Application No. 10-2021-0078994, filed on Jun. 17, 2021, in the Korean Intellectual Property Office, the disclosure of which is incorporated by reference herein in its entirety.

BACKGROUND

The present disclosure relates to a circuit and method for trimming a period of an oscillator clock signal, and more particularly, to trimming a period of an oscillator clock signal by using a circuit included in a chip on a wafer.

An oscillator inside a memory is tested using a test code of a subsystem having a central processing unit (CPU) mounted thereon. However, depending on a process environment of the memory, the subsystem having the CPU mounted thereon may not be used, and in this case, logic for testing the oscillator independently of the CPU is required. Moreover, for reasons such as a limitation of test equipment, etc., it is necessary to reduce the complexity and time of a test for the oscillator.

SUMMARY

It is an aspect to provide a clock generating circuit and method for trimming a period of an oscillator clock signal, in which an oscillator may be tested independently of a subsystem having a central processing unit (CPU) mounted thereon.

According to an aspect of one or more embodiments, there is provided a clock generating circuit comprising an oscillator configured to output an oscillator clock signal having a period based on a trim value; a clock counter configured to count the oscillator clock signal for a reference time; a finite state machine configured to obtain, from the clock counter, a count value of the oscillator clock signal that is counted, and in a test mode, compare the count value with a target count value and change the trim value based on a comparison result and determine a final trim value based on the trim value that is changed; and a non-volatile memory that stores the final trim value that is determined.

According to another aspect of one or more embodiments, there is provided a system comprising a plurality of chips in a wafer, and a test device. Each chip comprises a clock generating circuit comprising an oscillator configured to output an oscillator clock signal having a period based on a trim value; a clock counter configured to count the oscillator clock signal for a reference time; a finite state machine configured to obtain, from the clock counter, a count value of the oscillator clock signal that is counted, and in a test mode, compare the count value with a target count value and change the trim value based on a comparison result and determine a final trim value based on the trim value that is changed; and a non-volatile memory that stores the final trim value that is determined. The test device is configured to test one or more of the plurality of chips, and the plurality of chips are connected in parallel to the test device.

According to another aspect of one or more embodiments, there is provided a method comprising outputting, by an oscillator, an oscillator clock signal having a period based on a trim value; counting, by a clock counter, the oscillator clock signal for a reference time; and obtaining, by a finite state machine, a count value for the oscillator clock signal that is counted, and in a test mode, comparing the count value with a target count value and changing the trim value based on a comparison result and determining a final trim value based on the trim value that is changed.

BRIEF DESCRIPTION OF THE DRAWINGS

Various embodiments will be more clearly understood from the following detailed description taken in conjunction with the accompanying drawings in which.

DETAILED DESCRIPTION

Hereinafter, various embodiments will be described with reference to the accompanying drawings.

Figure 1:
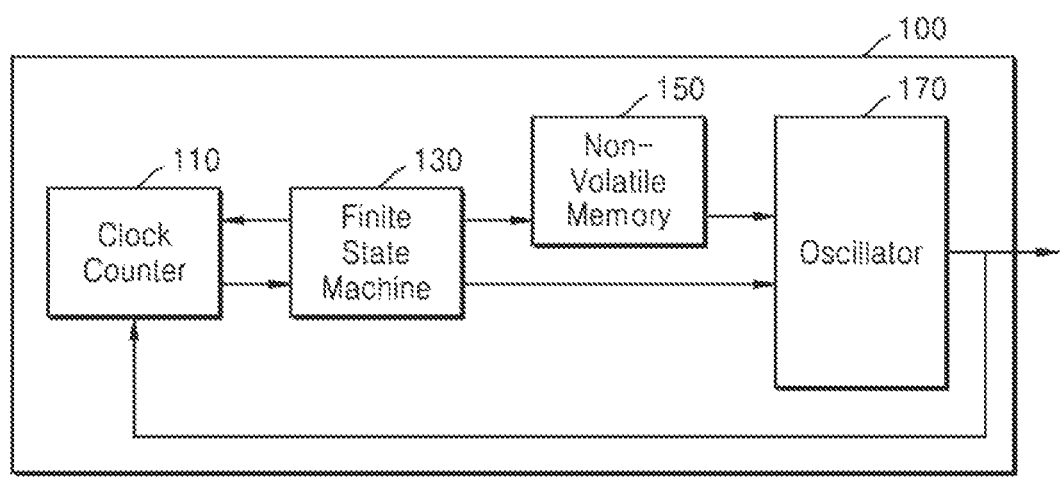
FIG. 1 is a block diagram of a clock generating circuit according to an embodiment.

FIG. 1 is a block diagram of a clock generating circuit according to an embodiment.

Referring to FIG. 1, a clock generating circuit 100 for trimming a period of an oscillator clock signal may include a clock counter 110, a finite state machine 130, a non-volatile memory 150, and/or an oscillator 170.

The clock generating circuit 100 may be a clock generating circuit included in a chip arranged on a wafer. The clock generating circuit 100 may be connected to a test device for testing the chip arranged on the wafer.

The clock generating circuit 100 may be a digital circuit. Thus, an analog circuit for comparing speeds of clock signals may not be required.

Moreover, the clock generating circuit 100 may be implemented using a standard cell. Thus, the clock generating circuit 100 may have a low dependency.

The oscillator 170 may be a module configured to output an oscillator clock signal. The oscillator clock signal may be transmitted to another module that uses a clock signal such as a system on a chip (SoC) logic, an embedded non-volatile memory (eNVM), etc., and may be transmitted to the clock counter 110.

The oscillator 170 may be a module configured to receive a trim value from the finite state machine 130. The trim value may be a value for determining a period of an oscillator clock signal. Thus, the oscillator 170 may be configured to output the oscillator clock signal having the period determined based on the trim value.

The clock counter 110 may be a module configured to count a number of pulses of an input clock signal. The clock counter 110 may receive the oscillator clock signal from the oscillator 170. The clock counter 110 may be configured to count the received oscillator clock signal for a reference time. In some embodiments, the reference time may change with capabilities, etc., of modules such as an oscillator, etc. included in the clock generating circuit 100. For example, the reference time may be, but is not limited to, about 1 ms.

The clock counter 110 may be configured to output a count value for the counted oscillator clock signal to the finite state machine 130. The count value for the oscillator clock signal may be a value obtained by counting, by the clock counter 110, the number of pulses of the oscillator clock counter 110 for the reference time.

The finite state machine 130 may be a machine having a finite number of states. The finite state machine 130 may be configured to switch a state depending on a given input or to output an output signal according to a condition.

The finite state machine 130 may be configured to obtain the count value for the oscillator clock signal counted by the clock counter 110. The finite state machine 130 may be configured to change the trim value based on the count value. The finite state machine 130 may output a signal having the changed trim value to the non-volatile memory 150 and/or the oscillator 170.

The finite state machine 130 may be configured to determine a final trim value by changing the trim value. The final trim value may mean a trim value that enables the oscillator 170 to output an oscillator clock signal having a target period.

The finite state machine 130 may be configured to operate in any one of a test mode, a verify mode, and a manual trim mode. For example, a test device connected to the finite state machine 130 may set the finite state machine 130 to operate in any one of the test mode, the verify mode, and the manual trim mode.

The test mode may be a mode for trimming the period of the oscillator clock signal to output the oscillator clock signal having the target period. More specifically, the finite state machine 130 may be configured to determine the final trim value to be used to output the oscillator clock signal having the target period. For example, the finite state machine 130 may be configured to change the trim value based on the count value for the oscillator clock signal and a target count value. The target count value may be a count value obtained by counting the oscillator clock signal having the target period.

The finite state machine 130 may be configured to compare the count value for the oscillator clock signal with the target count value and change the trim value based on a comparison result, in the test mode. The finite state machine 130 may be configured to determine the final trim value based on the changed trim value.

The period of the oscillator clock signal may be trimmed through the finite state machine 130, such that the clock generating circuit 100 may independently trim the period of the oscillator clock signal without depending on a system having a central processing unit (CPU) mounted thereon, thereby trimming the period of the oscillator clock signal even when the system having the CPU mounted thereon is not available or when test logic for trimming the period of the oscillator clock signal is omitted in the system having the CPU mounted thereon.

The verify mode may be a mode for verifying whether the count value for the oscillator clock signal having the period determined based on the final trim value obtained by an operation of the test mode falls within a range of the target count value.

For example, in the verify mode, the finite state machine 130 may be configured to determine whether the count value for the oscillator clock signal having the period determined based on the final trim value is less than an upper limit and greater than a lower limit. In other words, in the verify mode, the finite state machine 130 may determine whether the count value is within a threshold range. In the verify mode, the finite state machine 130 may be configured to output a determination result to the test device. The test device having received the determination result may determine based on the determination result whether an operation of the test mode is successfully performed. For example, when the determination result indicating that the count value is less than the upper limit and greater than the lower limit is received, it may be determined that the operation of the test mode is successfully performed. That is, the test device may be configured to determine that trimming of the period of the oscillator clock signal in the test mode is successful when the test device receives the determination result indicating that the count value is less than the upper limit and greater than the lower limit.

The manual trim mode may be a mode for identifying the period of the oscillator clock signal.

For example, in the manual trim mode, the finite state machine 130 may be configured to obtain the count value for the oscillator clock signal and output the count value to the test device. The test device may obtain the period of the oscillator clock signal based on the count value for the oscillator clock signal. The verify mode and the manual trim mode will be described later in more detail.

The non-volatile memory 150 may be configured to store the trim value. In some embodiments, the stored trim value may be the final trim value. The non-volatile memory 150 may be configured to output a signal having the stored trim value to the oscillator 170.

After the operation of the test mode is performed, the final trim value may be stored in the non-volatile memory 150. The oscillator 170 may output the oscillator clock signal based on the final trim value obtained from the non-volatile memory 150. Thus, the clock generating circuit 100 according to an embodiment may output the oscillator clock signal having the target period by using the final trim value stored in the non-volatile memory 150 without additionally performing an operation of trimming the period of the oscillator clock signal after the operation of the test mode is performed. In other words, the clock generating circuit 100 may output the oscillator clock signal having the target period using the final trim value without having a separate mode for trimming the period of the oscillator clock signal.

Figure 2:
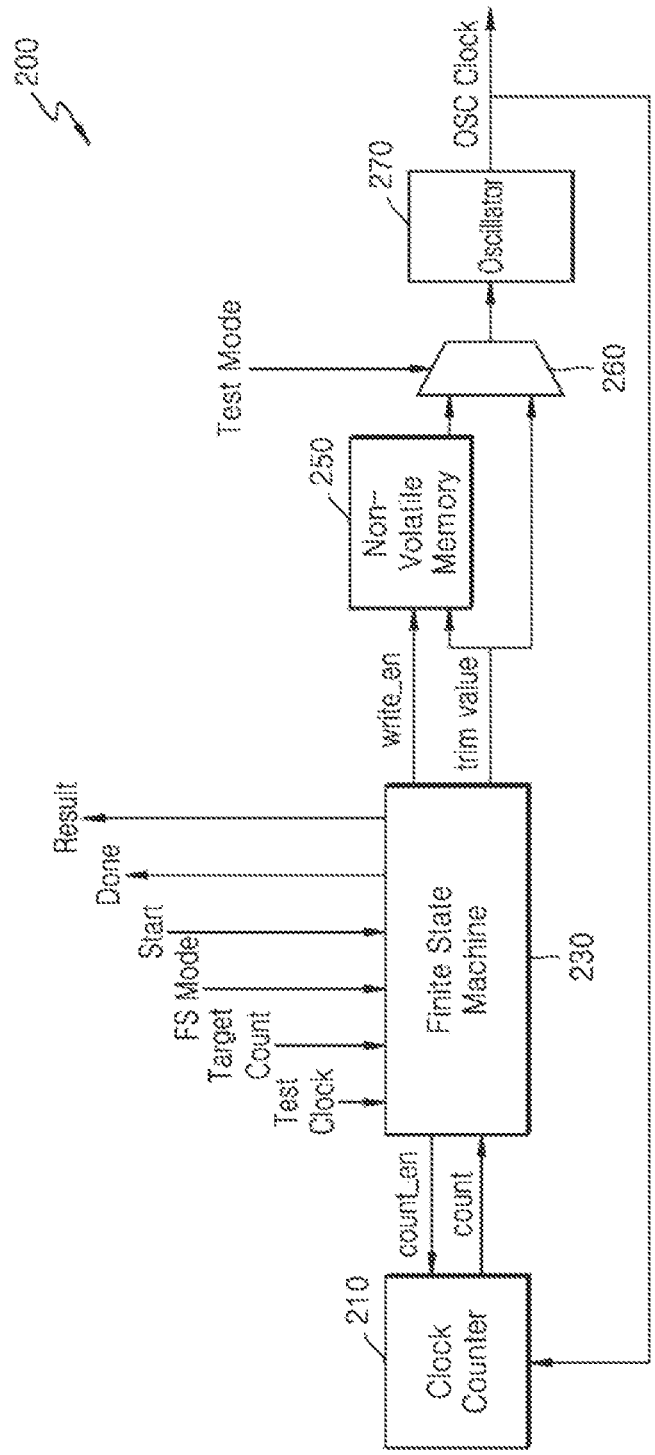
FIG. 2 is a block diagram of a clock generating circuit according to an embodiment.

FIG. 2 is a block diagram of a clock generating circuit according to an embodiment.

Referring to FIG. 2, a clock generating circuit 200 for trimming a period of an oscillator clock signal according to an embodiment may include a clock counter 210, a finite state machine 230, a non-volatile memory 250, a multiplexer 260, and/or an oscillator 270.

The clock counter 210, the finite state machine 230, the non-volatile memory 250, and/or the oscillator 270 may correspond to the clock counter 110, the finite state machine 130, the non-volatile memory 150, and/or the oscillator 170 of FIG. 1, respectively, and may be configured to perform the same functions as those of the clock counter 110, the finite state machine 130, the non-volatile memory 150, and/or the oscillator 170 of FIG. 1, respectively.

The oscillator 270 may output an oscillator clock signal OSC Clock to another module that uses a clock signal such as a system on a chip (SoC) logic, an embedded non-volatile memory (eNVM), etc. The oscillator 270 may output the clock signal OSC Clock to the clock counter 210. As described above, the clock counter 210 may receive the oscillator clock signal OSC Clock from the oscillator 270 and count the oscillator clock signal for the reference time. The count value for the counted oscillator clock signal may be output to the finite state machine 230.

The finite state machine 230 may output a count enable signal count_en to the clock counter 210. The clock counter 210 may determine whether to operate based on the count enable signal count_en. In other words, in some embodiments, the finite state machine 230 may control an operation of the clock counter 210. For example, the clock counter 210 may be configured to count the oscillator clock signal when a count enable signal count_en having a value of 1 is input to the clock counter 210. When a count enable signal count_en having a value of 0 is input to the clock counter 210, the clock counter 210 may stop counting the oscillator clock signal. However, embodiments are not limited thereto. In some embodiments, the clock counter 210 may be configured to count the oscillator clock signal then the count enable signal count_en having a value of 0 is input to the clock counter 210, and to stop counting the oscillator clock signal when the clock enable signal count_en having a value of 1 is input to the clock counter 210.

The finite state machine 230 may output the clock enable signal having a value of 1 to enable the clock counter 210 to operate and, after an elapse of the reference time, may output the clock enable signal having a value of 0 to stop the operation of the clock counter 210. Thus, the clock counter 210 may output a signal that has a count value obtained by counting the oscillator clock signal for the reference time, to the finite state machine 230.

The finite state machine 230 may be configured to receive a test clock signal Test Clock from the test device. The period of the test clock signal may be determined based on capabilities, etc., of a chip to be tested, regardless of the target period of the oscillator clock signal. The period of the test clock signal may be calculated and determined by the test device. Thus, a reference clock may be omitted from the clock generating circuit 200. The finite state machine 230 receives an independent test clock signal, such that the finite state machine 230 does not need to be driven at a high frequency even when a target frequency of the oscillator clock signal is high, and thus, the chip test may be performed with low power when the clock generating circuit 200 is used. In other words, the finite state machine 230 may receive a test clock signal that is independent of the oscillator clock signal. In some embodiments, the term "independent" may mean that the test clock signal starts, ends, and/or changes without dependence on a start, an end, and/or a change in the oscillator clock signal, and the oscillator clock signal starts, ends, and/or changes without dependence on a start, an end, and/or a change in the test clock signal. In some embodiments, alternatively or additionally, the term "independent" may mean that a period of the test clock signal is different than a period of the oscillator clock signal.

The finite state machine 230 may be configured to receive the target count value Target Count from the test device. As described above, the finite state machine 230 may be configured to change the trim value based on the count value for the oscillator clock signal and the target count value Target Count that is input to the finite state machine 230.

The finite state machine 230 may be configured to receive a start signal Start from the test device. The finite state machine 230 may perform an operation in response to the start signal Start.

The finite state machine 230 may be configured to output an end signal Done to the test device. The finite state machine 230 may output the end signal Done to the test device when the operation is determined to end. In other words, in some embodiments, the test device may control the finite state machine 230 to start operation and to stop operation.

The finite state machine 230 may be configured to output a result signal Result of the operation to the test device. For example, the finite state machine 230 may be configured to output the count value for the oscillator clock signal obtained in the manual trim mode to the test device as the result signal Result.

The finite state machine 230 may receive a mode signal FS Mode from the test device. The mode signal FS Mode may be a signal for determining a mode in which the finite state machine 230 operates. As described above, the mode may be any one of the test mode, the verify mode, and the manual trim mode.

The finite state machine 230 may be configured to output the trim value to the non-volatile memory 250 and/or the multiplexer 260. For example, the finite state machine 230 may change the trim value as described above and may output the trim value that is changed to the non-volatile memory 250 and/or the multiplexer 260. The finite state machine 230 may be configured to output a write enable signal write_en to the non-volatile memory 250. For example, when the finite state machine 230 determines the changed trim value as the final trim value, the finite state machine 230 may store the final trim value in the non-volatile memory 250 by using the write enable signal write_en.

The non-volatile memory 250 may be configured to store the trim value in response to the write enable signal write_en.

The multiplexer 260 may be configured to receive a signal having the trim value from the finite state machine 230, receive an output signal of the non-volatile memory 250, and receive a test mode signal Test Mode from the test device. The multiplexer 260 may be configured to output the trim value to the oscillator 270 based on the test mode signal Test Mode. For example, when the test mode is performed in response to the test mode signal Test Mode, the trim value of the multiplexer 260 may be output to the oscillator 270. When the test mode ends, the trim value stored in the non-volatile memory 250 may be output to the oscillator 270, without being limited thereto. For example, in some embodiments, when the test mode signal Test Mode has a value of 1, the multiplexer 260 may select the trim value and output the trim value to the oscillator 270, and when the test mode signal Test Mode has a value of 0, the multiplexer 260 may select the stored trim value and output the stored trim value to the oscillator 270. However, embodiments are not limited thereto and, in other embodiments, when the test mode signal Test Mode has a value of 0, the multiplexer 260 may select the trim value and output the trim value to the oscillator 270, and when the test mode signal Test Mode has a value of 1, the multiplexer 260 may select the stored trim value and output the stored trim value to the oscillator 270.

Figure 3:
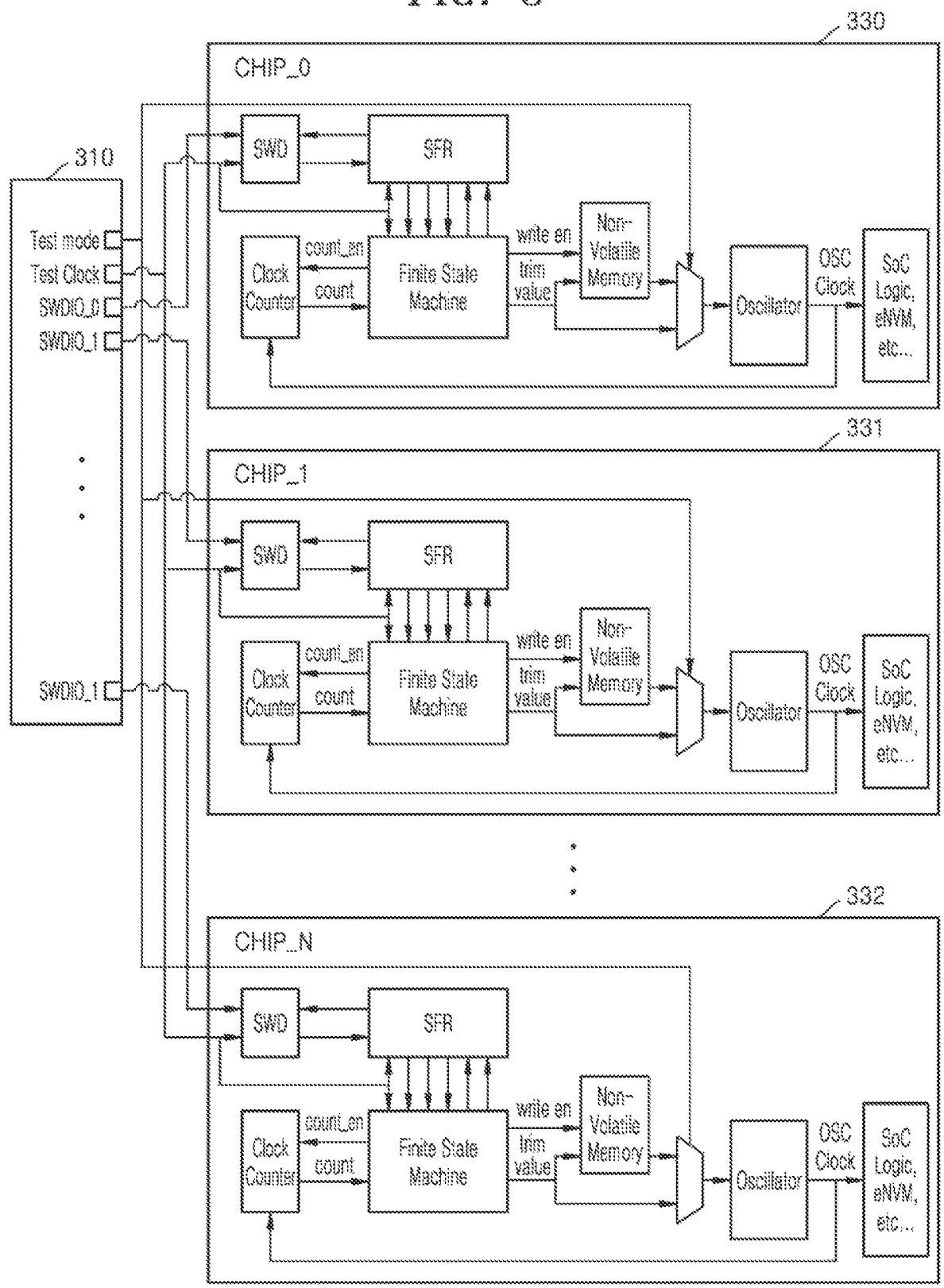
FIG. 3 is a block diagram of a system according to an embodiment.

FIG. 3 is a block diagram of a system according to an embodiment.

Referring to FIG. 3, a system for trimming a period of an oscillator clock signal according to an embodiment may include a test device 310 and a plurality of chips CHIP_0 330, CHIP_1 331, to CHIP_N 332.

The test device 310 may be a device for testing a chip in a wafer. For example, the test device 310 may be an automated test equipment (ATE), but is not limited thereto.

Each of the plurality of chips 330, 331, to 332 (i.e., the plurality of chips CHIP_0 330, CHIP_1 331, to CHIP_N 332) may include a clock generating circuit for trimming a period of an oscillator clock signal according to an embodiment. That is, each of the plurality of chips 330, 331, and 332 may include a clock counter, a finite state machine, a non-volatile memory, and/or an oscillator, as described above with reference to FIGS. 1 and 2.

The plurality of chips 330, 331, and 332 may be connected in parallel to the test device 310. When the clock generating circuit is used, the test device 310 may identify a test result by determining pass or failure without performing complex computations or additional computations on an output value of the clock generating circuit. For example, when the finite state machine operates in the verify mode after performing an operation of the test mode, the finite state machine may determine whether the count value for the oscillator clock signal falls within a range from an upper limit to a lower limit and output a determination result to the test device 310 that may determine pass or failure based on the determination result. Thus, the test device 310 may test the plurality of chips 330, 331, and 332 in parallel at the same time because there is no need to perform complex computations or additional computations. Thus, a test time for trimming the period of the oscillator clock signal may be significantly reduced. For example, when 256 chips are tested in parallel in comparison to when a single chip is serially tested, the test time may be reduced by 1/256 times.

The finite state machine included in each of the plurality of chips 330, 331, and 332 may input and output a signal without a limitation in a type of an interface. In some embodiments, the finite state machine may use an interface for each system on chip (SoC). For example, in some embodiments, the finite state machine may include a serial wire debug (SWD) and a special function register (SFR). The test device 310 may use the serial wire debug (SWD) to set the special function register (SFR), and the special function register (SFR) may in turn provide the various signals discussed above to the finite state machine.

Figure 4:
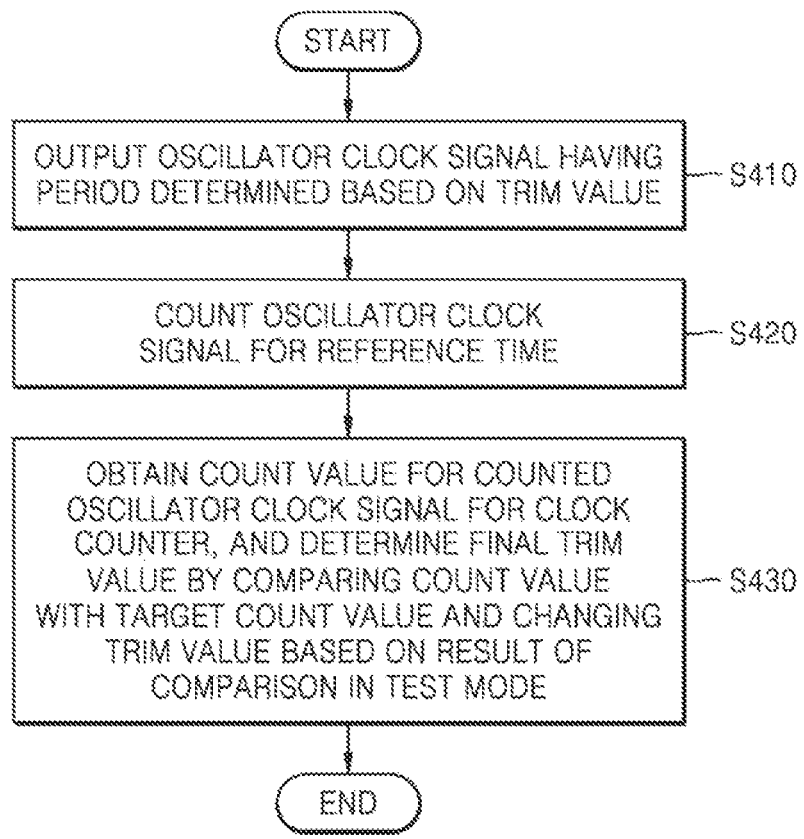
FIG. 4 is a flowchart of a method of trimming a period of an oscillator clock signal, according to an embodiment.

FIG. 4 is a flowchart of a method of trimming a period of an oscillator clock signal, according to an embodiment.

Referring to FIG. 4, a method of trimming a period of an oscillator clock signal according to an embodiment may include a plurality of operations S410, S420, and S430.

In operation S410, an oscillator clock signal having a period determined based on a trim value may be output. For example, the method of trimming the period of the oscillator clock signal may output the oscillator clock signal having the period determined based on the trim value, by using an oscillator.

In operation S420, the oscillator clock signal may be counted for the reference time. For example, the method of trimming the period of the oscillator clock signal may count the oscillator clock signal for the reference time by using a clock counter.

In operation S430, a count value for the counted oscillator clock signal may be obtained, and the count value may be compared with a target count value and the trim value may be changed based on a comparison result in the test mode, to determine a final trim value. For example, the method of trimming the period of the oscillator clock signal may obtain the count value for the counted oscillator clock signal from the clock counter by using the finite state machine, and in the test mode, compare the count value with the target count value and change the trim value based on a comparison result to determine the final trim value.

Figure 5:
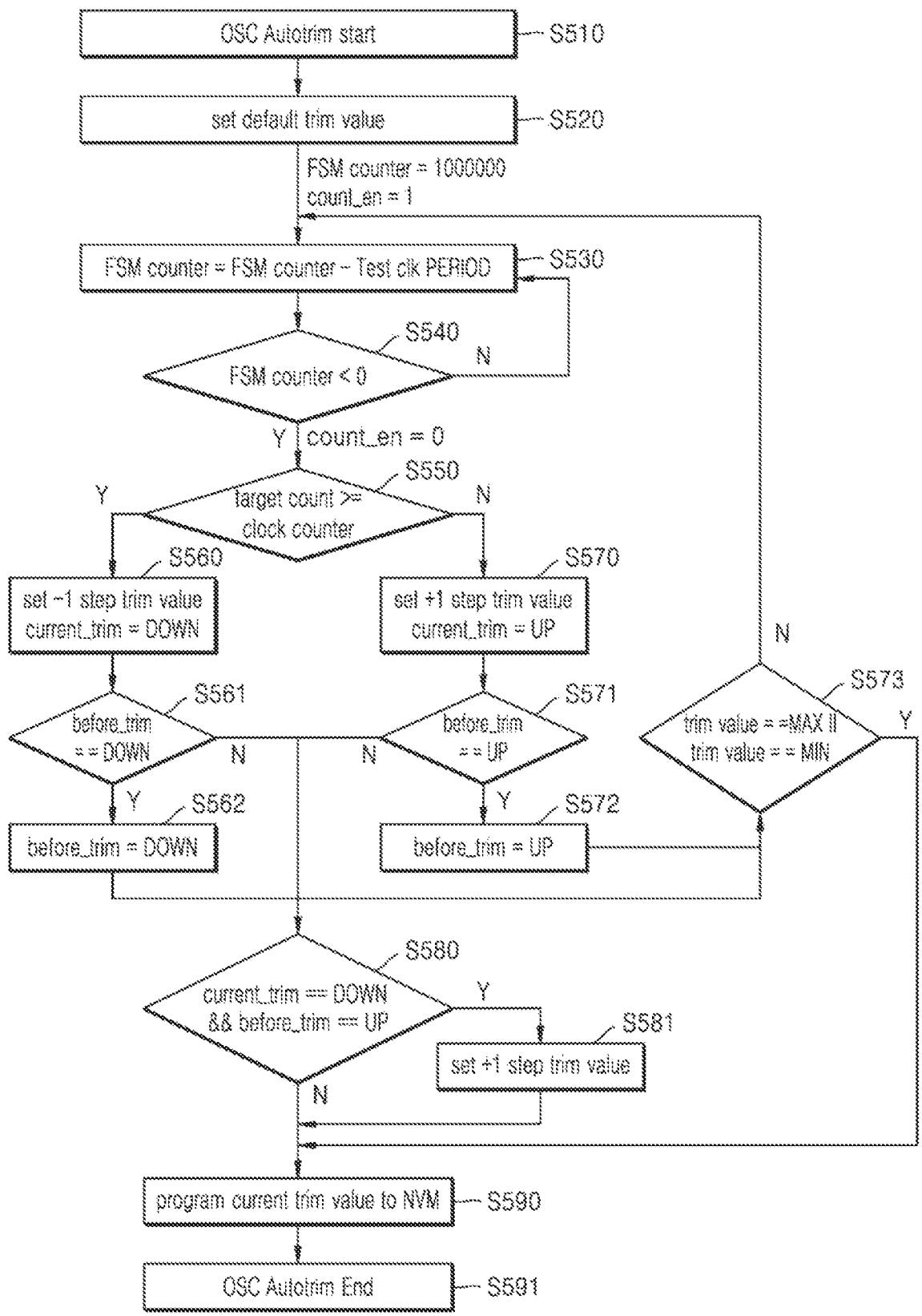
FIG. 5 is a flowchart of an algorithm for trimming a period of an oscillator clock signal, according to an embodiment.

FIG. 5 is a flowchart of an algorithm for trimming a period of an oscillator clock signal, according to an embodiment.

Referring to FIG. 5, in operation S510, a test mode for trimming a period of an oscillator clock signal may start.

In operation S520, the oscillator may output the oscillator clock signal for a default trim value. Moreover, assuming that the above-described reference time is 1 ms, a finite state machine (FSM) counter value based on an ns unit may be set to 1000000, and the clock counter may operate through the count enable signal count_en. For example, a value of the count enable signal count_en may be set to 1.

In operation S530, a value obtained by subtracting a period of a test clock from the FSM counter value may be calculated.

In operation S540, it may be determined whether the FSM counter value is less than 0. In operation S540, when the value obtained by subtracting the period of the test clock from the FSM counter value is less than 0 (S540, Y), an operation of the clock counter may be stopped by setting the value of the count enable signal count_en to 0. When the value obtained by subtracting the period of the test clock from the FSM counter value is greater than or equal to 0 (S540, N), the period of the test clock may be subtracted again from the FSM counter value. That is, an algorithm for obtaining a count value for an oscillator clock signal may be executed while a time of 1 ms passes.

In operation S550, it may be determined whether a target count value input from the test device is greater than or equal to the count value for the oscillator clock signal counted for a reference time.

When the target count value is greater than or equal to the count value (S550, Y), the finite state machine may stepwisely reduce a trim value in operation S560. More specifically, the finite state machine may reduce the trim value by one step (1 step). In this case, the amount of the trim value reduced by one step may be determined depending on a test environment. An operation current_trim performed on the current trim value may be set to DOWN.

In operation S561, the finite state machine may determine whether an operation before_time performed on a previous trim value is DOWN or not.

When operation S562, i.e., the operation before_trim performed on the previous trim value, is DOWN (S562, Y), the finite state machine may determine whether the trim value is an upper limit MAX or a low limit MIN in operation S573.

When it is determined in operation S561 that the operation before_time performed on the previous trim value is not DOWN (S561, N), it may be determined in operation S580 whether the operation current_time performed on the current trim value is DOWN and whether the operation before_time performed on the previous trim value is UP.

When it is determined in operation S550 that the target count value is less than the count value (S550, N), the finite state machine may stepwisely increase the trim value in operation S570. More specifically, the finite state machine may increase the trim value by one step (1 step). In this case, the amount of the trim value increased by one step may be determined depending on the test environment. The operation current_trim performed on the current_trim value may be set to UP.

In operation S571, the finite state machine may determine whether the operation before_time performed on the previous trim value is UP or not.

When operation S572, i.e., the operation before_trim performed on the previous trim value, is UP (S571, Y), the finite state machine may determine whether the trim value is an upper limit or a low limit in operation S573.

When it is determined in operation S571 that the operation before_time performed on the previous trim value is not UP (S571, N), it may be determined in operation S580 whether the operation current_time performed on the current trim value is DOWN and whether the operation before_time performed on the previous trim value is UP.

When the trim value is the upper limit or the lower limit (S573, Y), the current trim value may be programmed in a non-volatile memory in operation S590. In some embodiments, the non-volatile memory may be an embedded non-volatile memory (eNVM). When the trim value either is not the upper limit or is not the lower limit (S573, N), the process may return to operation S530.

It may be determined in operation S580 whether the operation performed on the current trim value is DOWN and the operation performed on the previous trim value is UP. When the operation performed on the current trim value is DOWN and the operation performed on the previous trim value is UP (S580, Y), the trim value may be increased by one step in operation S581.

When the operation performed on the current trim value either is not DOWN or the operation performed on the previous trim value is not UP (S580, N), the current trim value may be programmed in the non-volatile memory in operation S590. In some embodiments, the non-volatile memory may be an embedded non-volatile memory (eNVM).

That is, the finite state machine may be configured to stepwisely reduce the trim value when the count value for the oscillator clock signal is less than or equal to the target count value. The finite state machine may be configured to stepwisely increase the trim value when the count value for the oscillator clock signal is greater than the target count value.

The oscillator may be configured to output the oscillator clock signal having a shorter period as the input trim value decreases.

The finite state machine may be configured to determine, as a final trim value, the trim value corresponding to a time when the count value starts to be greater than the target count value as the count value increases, when the trim value is stepwisely reduced.

The finite state machine may be configured to determine, as the final trim value, the trim value corresponding to a time immediately before the count value starts to be greater than the target count value as the count value decreases, when the trim value is stepwisely increased.

That is, the finite state machine may determine, as the final trim value, a trim value corresponding to the count value exceeding the target count value, when the count value exceeds the target count value as the count value increases.

In addition, the finite state machine may determine, as the final trim value, a trim value corresponding to the count value less than the target count value, when the count value is less than the target count value as the count value decreases.

The finite state machine may be configured to determine, as the final trim value, a trim value corresponding to a value that is closest to the target count value among count values exceeding the target count value, without being limited thereto. That is, the finite state machine may be configured to determine, as the final trim value, a trim value corresponding to a value that is closest to the target count value among count values less than the target count value, without being limited thereto.

The non-volatile memory may be configured to store the determined final trim value.

In operation S591, when the current trim value is programmed in the non-volatile memory, the algorithm for trimming the period of the oscillator clock signal may end.

Figure 6:
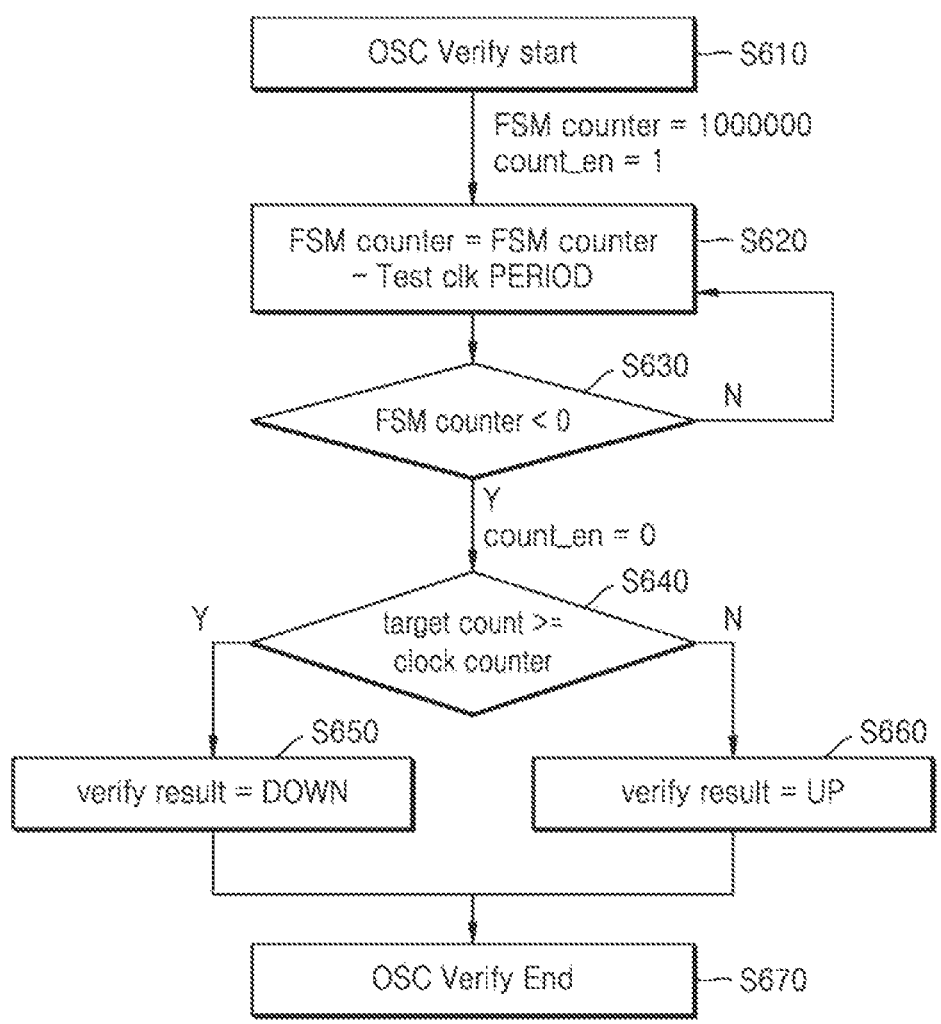
FIG. 6 is a flowchart for describing a verify mode according to an embodiment.

FIG. 6 is a flowchart for describing a verify mode according to an embodiment.

Referring to FIG. 6, in operation S610, a method according to an embodiment may start a verify mode operation.

As described above in relation to FIG. 5, assuming that the reference time for counting, by the clock counter, the oscillator clock signal, is 1 ms, the FSM counter value may be set to 1000000. To operate the clock counter, the value of the count enable signal count_en may be set to 1.

In operation S620, the finite state machine may subtract a period of a test clock from the FSM counter value.

In operation S630, the finite state machine may determine whether a value obtained by subtracting the period of the test clock from the FSM counter value is less than 0. When the value obtained by subtracting the period of the test clock from the FSM counter value is greater than or equal to 0 (S630, N), the process may return to operation S620 and the period of the test clock may be subtracted again from the value obtained by subtracting the period of the test clock from the FSM counter value.

When the value obtained by subtracting the period of the test clock from the FSM counter value is less than 0 (S630, Y), the value of the count enable signal count_en may be set to 0 to stop the operation of the clock counter. In operation S640, the finite state machine may determine whether the target count value input from the test device is greater than or equal to the count value for the oscillator clock signal.

When the count value for the oscillator clock signal is greater than or equal to the target count value (S640, Y), a verify result may be set to DOWN in operation S650.

When the count value for the oscillator clock signal is less than the target count value (S640, N), the verify result may be set to UP in operation S660.

As described above, when the verify result is set to DOWN or UP, the verify mode may end in operation S670.

That is, the method illustrated in FIG. 6 may set a result value of the verify mode to UP because the count value for the oscillator clock signal is greater than the target count value, when the current period of the oscillator clock signal is shorter than a target period, and may set the result value of the verify mode to DOWN in the opposite case. Thus, the method illustrated in FIG. 6 may determine whether the count value for the oscillator clock signal is less than the upper limit and whether the count value is greater than the lower limit, and determine whether the period of the oscillator clock signal is trimmed within a desired range.

Figure 7:
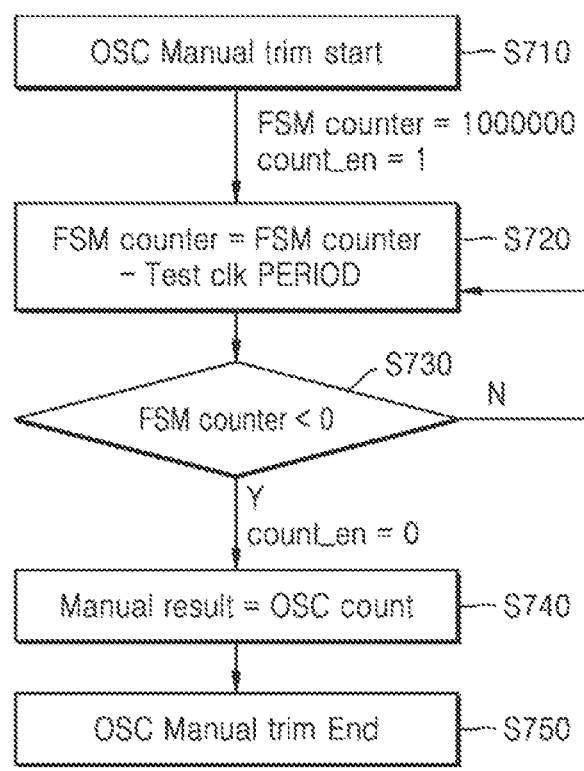
FIG. 7 is a flowchart for describing a manual trim mode according to an embodiment.

FIG. 7 is a flowchart for describing a manual trim mode according to an embodiment.

Referring to FIG. 7, in operation S710, a method may start a manual trim mode operation.

As described above in relation to FIG. 5, assuming that the reference time for counting, by the clock counter, the oscillator clock signal is 1 ms, the FSM counter value may be set to 1000000. To operate the clock counter, the value of the count enable signal count_en may be set to 1.

In operation S720, the finite state machine may subtract a period of a test clock from the FSM counter value.

In operation S730, the finite state machine may determine whether a value obtained by subtracting the period of the test clock from the FSM counter value is less than 0. When the value obtained by subtracting the period of the test clock from the FSM counter value is greater than or equal to 0 (S730, N), the process may return to operation S720 and the period of the test clock may be subtracted again from the value obtained by subtracting the period of the test clock from the FSM counter value.

When the value obtained by subtracting the period of the test clock from the FSM counter value is less than 0 (S730, Y), the value of the count enable signal count_en may be set to 0 to stop an operation of the clock counter. In operation S740, the finite state machine may set the count value for the oscillator clock signal to a manual result of the manual trim mode.

In operation S750, the method may terminate the manual trim mode.

Figure 8:
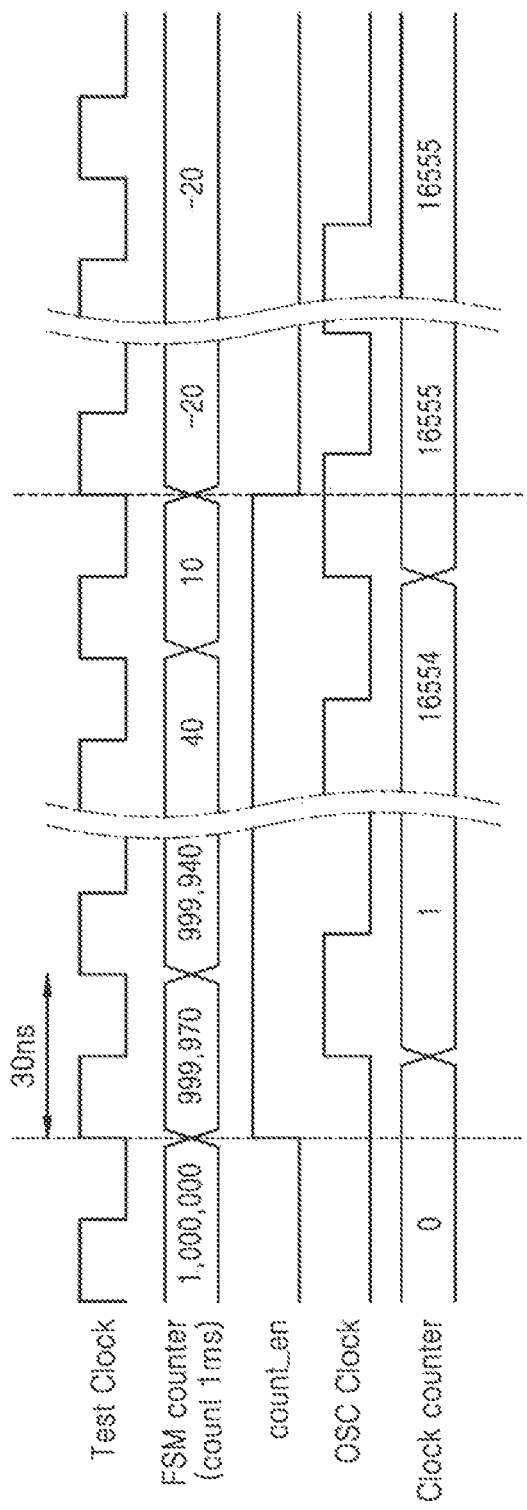
FIG. 8 is a timing diagram for describing counting according to an embodiment.

FIG. 8 is a timing diagram for describing counting according to an embodiment.

Referring to FIG. 8, as described above with reference to FIGS. 5 through 7, the FSM counter value may be set to 1000000 ns. The value 1000000 ns may be based on an assumption that the reference time for counting the oscillator clock signal is 1 ms. A period, 30 ns, of a test clock signal may be subtracted from the FSM counter value, and a count value for an oscillator clock signal, 16554, may be obtained, based on a value immediately before the value that is obtained by subtracting the period of the test clock signal from the FSM counter value is 0.

However, the values, e.g., 1 ms, 1000000 ns, etc., included in the foregoing description are exemplary and embodiments are not limited thereto. For example, the period of the test clock signal may differ by chip, and for each chip may be a fixed value or a variable value in one chip.

Figure 9:
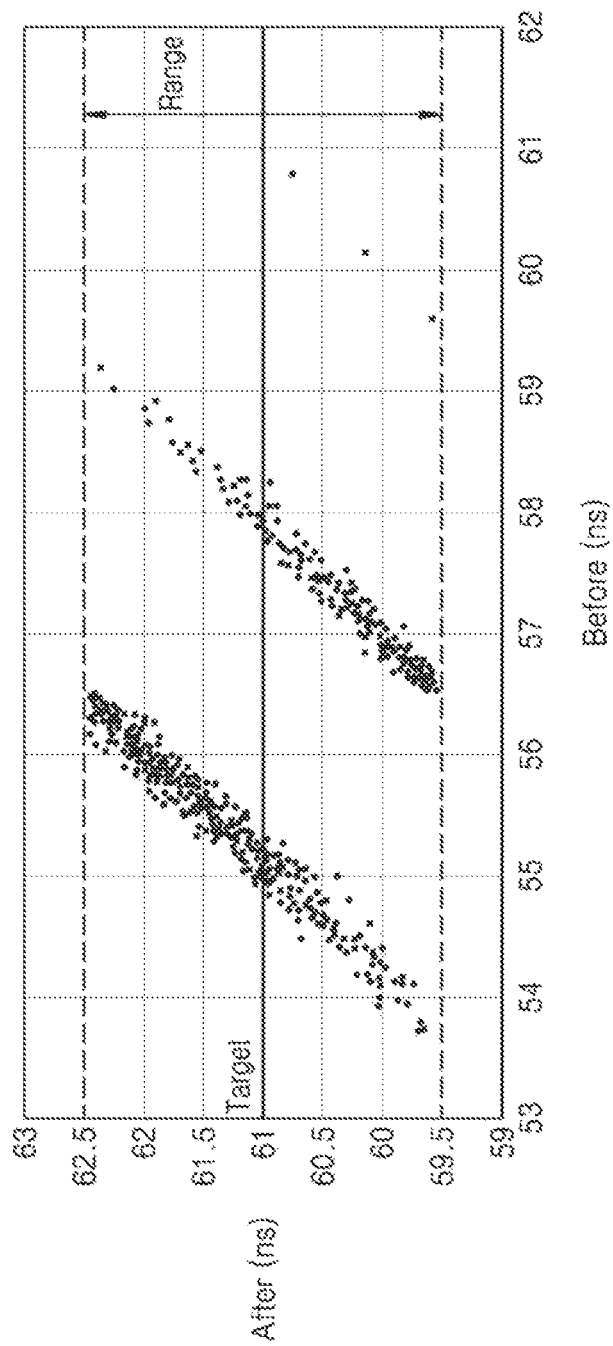
FIG. 9 is a graph for describing a period of an oscillator clock signal, trimmed by a clock generating circuit, according to an embodiment.

FIG. 9 is a graph for describing a period of an oscillator clock signal, trimmed by a clock generating circuit, according to an embodiment.

In FIG. 9, periods of the oscillator clock signal before trimming and periods of the oscillator clock signal, trimmed by the clock generating circuit according to an embodiment, are shown as a graph.

Referring to FIG. 9, the periods of the oscillator clock signal before trimming are distributed between 53 ns and 61 ns. When the periods of the oscillator clock signal are trimmed with a target period of 61 ns using the method of trimming the period according to an embodiment, the periods of the oscillator clock signal may be distributed between 59.5 ns and 62.5 ns and the periods of the oscillator clock signal may be trimmed effectively.

While various embodiments have been particularly shown and described with reference to the drawings, it will be understood that various changes in form and details may be made therein without departing from the spirit and scope of the following claims.

What is claimed is:

1. A clock generating circuit comprising:
an oscillator configured to output an oscillator clock signal having a period based on a trim value;
a clock counter configured to count the oscillator clock signal for a reference time;
a finite state machine configured to obtain, from the clock counter, a count value of the oscillator clock signal that is counted, and in a test mode, compare the count value with a target count value and change the trim value based on a comparison result and determine a final trim value based on the trim value that is changed; and
a non-volatile memory that stores the final trim value that is determined,
wherein the oscillator is configured to output the oscillator clock signal having a shorter period as the trim value decreases.

2. The clock generating circuit of claim 1, wherein the finite state machine is further configured to:
reduce the count value by stepwisely increasing the trim value, when the count value is greater than the target count value; and
increase the count value by stepwisely reducing the trim value, when the count value is less than or equal to the target count value.

3. The clock generating circuit of claim 2, wherein the finite state machine is further configured to:
determine a trim value corresponding to the count value that exceeds the target count value as the final trim value when the count value exceeds the target count value as the count value increases; and
determine a trim value corresponding to the count value that is less than the target count value as the final trim value when the count value is less than the target count value as the count value decreases.

4. The clock generating circuit of claim 2, wherein the finite state machine is further configured to determine, as the final trim value, a trim value corresponding to a value that is closest to the target count value among count values that exceed the target count value.

5. The clock generating circuit of claim 3, wherein the finite state machine is further configured to store, in the non-volatile memory, the final trim value that is determined, and
the oscillator is further configured to output the oscillator clock signal having a period based on the final trim value that is stored.

6. The clock generating circuit of claim 1, wherein the finite state machine is further configured to, in a verify mode, determine whether the count value for the oscillator clock signal having the period based on the final trim value is less than an upper limit and greater than a lower limit, and output a determination result to a test device.

7. The clock generating circuit of claim 1, wherein the finite state machine is further configured to, in a manual trim mode, output the count value to a test device.

8. The clock generating circuit of claim 1, wherein the finite state machine is further configured to receive a test clock signal that is independent of the oscillator clock signal, and cause the clock counter to operate for the reference time according to the test clock signal.

9. A system comprising:
a plurality of chips in a wafer, each chip comprising:
a clock generating circuit comprising an oscillator configured to output an oscillator clock signal having a period based on a trim value;
a clock counter configured to count the oscillator clock signal for a reference time;
a finite state machine configured to obtain, from the clock counter, a count value of the oscillator clock signal that is counted, and in a test mode, compare the count value with a target count value and change the trim value based on a comparison result and determine a final trim value based on the trim value that is changed; and
a non-volatile memory that stores the final trim value that is determined; and a test device configured to test one or more of the plurality of chips, wherein the plurality of chips are connected in parallel to the test device.

10. The system of claim 9, wherein the finite state machine is further configured to:

stepwisely increase the trim value when the count value is greater than the target count value; and stepwisely reduce the trim value when the count value is less than the target count value, and the oscillator is further configured to output the oscillator clock signal having a shorter period as the trim value decreases.

11. The system of claim 10, wherein the finite state machine is further configured to:

determine, as the final trim value, the trim value corresponding to a time when the count value starts to be greater than the target count value as the count value increases, when the trim value decreases stepwisely; and determine, as the final trim value, the trim value corresponding to a time immediately before the count value starts to be greater than the target count value as the count value decreases, when the trim value increases stepwisely.

12. The system of claim 11, wherein the finite state machine is further configured to store, in the non-volatile memory, the final trim value that is determined, and the oscillator is further configured to output the oscillator clock signal having a period based on the final trim value that is stored.

13. The system of claim 9, wherein the test device is configured to set the finite state machine to operate in any one of the test mode, a verify mode, and a manual trim mode.

14. The system of claim 13, wherein the finite state machine is configured to execute the test mode and, in the verify mode that is executed after the test mode is executed, determine whether the count value for the oscillator clock signal having the period based on the final trim value is less than an upper limit and greater than a lower limit, and output a determination result to the test device, and the test device is configured to determine that trimming of the period of the oscillator clock signal in the test mode was successful, when it is determined that the count value is less than the upper limit and greater than the lower limit.

15. The system of claim 13, wherein the finite state machine is further configured to, in the manual trim mode, output the count value to the test device, and the test device is configured to obtain the period of the oscillator clock signal, based on the count value that is output.

16. The system of claim 9, wherein the test device is configured to output a test clock signal to the finite state machine, the test clock signal having a period that is different from the period of the oscillator clock signal.

17. The system of claim 9, wherein the test device is configured to, for each of the plurality of chips, output, to the finite state machine of the chip, a target count value, wherein the target count values differ with the period of the oscillator clock signal for each of the plurality of chips.

18. A method comprising:

outputting, by an oscillator, an oscillator clock signal having a period based on a trim value;

counting, by a clock counter, the oscillator clock signal for a reference time; and obtaining, by a finite state machine, a count value for the oscillator clock signal that is counted, and in a test mode, comparing the count value with a target count value and changing the trim value based on a comparison result and determining a final trim value based on the trim value that is changed, wherein the outputting of the oscillator clock signal comprises outputting the oscillator clock signal having a shorter period as the trim value decreases.

19. The method of claim 18, wherein the determining of the final trim value comprises:

stepwisely increasing the trim value when the count value is greater than the target count value; and stepwisely reducing the trim value when the count value is less than the target count value.

* * * * *